US006317389B1

(12) United States Patent
Toda

(10) Patent No.: US 6,317,389 B1
(45) Date of Patent: Nov. 13, 2001

(54) ULTRASOUND-SIGNAL RADIATING DEVICE

(76) Inventor: Kohji Toda, 1-49-18 Futaba, Yokosuka (JP), 239-0814

( * ) Notice: Subject to any disclaimer, the term of this patent is extended or adjusted under 35 U.S.C. 154(b) by 0 days.

(21) Appl. No.: 09/557,041

(22) Filed: Apr. 21, 2000

(51) Int. Cl.[7] .................................................... H01L 41/08
(52) U.S. Cl. ............................................................ 367/164
(58) Field of Search .................................... 367/140, 157, 367/164; 310/313 B, 334, 322

(56) References Cited

U.S. PATENT DOCUMENTS 4,399,387 * 8/1983 Kohji .................................. 367/164

* cited by examiner

*Primary Examiner*—Daniel T. Pihulic

(57) ABSTRACT

An ultrasound-signal radiating device comprises a piezoelectric substrate, a first input interdigital transducer, a second input interdigital transducer, an output interdigital transducer, a cap, an amplifier, and a modulator with an input terminal. All the interdigital transducers are formed on one end surface of the piezoelectric substrate. The cap is mounted on a surface part of the other end surface of the piezoelectric substrate. If an input electric signal is applied to the first input interdigital transducer, a non-leaky elastic wave is excited in the piezoelectric substrate owing to the existence of the cap. The non-leaky elastic wave is detected at the output interdigital transducer as a delayed electric signal, which is amplified via the amplifier. A signal part of an amplified electric signal is fed back to the first input interdigital transducer, again. A remaining signal part, as a carrier signal, of the amplified electric signal is transmitted to the modulator, where an amplitude of the carrier signal is modulated according to an input message-signal applied from the input terminal. Thus, an AM signal is generated, and then, applied to the second input interdigital transducer. In this time, a leaky elastic wave is excited in the piezoelectric substrate, and radiated effectively in the form of a longitudinal wave into a liquid kept in contact with a remaining surface part of the other end surface of the piezoelectric substrate.

9 Claims, 11 Drawing Sheets

ULTRASOUND-SIGNAL RADIATING DEVICE

BACKGROUND OF THE INVENTION

1. Field of the Invention

The present invention relates to a device for radiating an ultrasound-signal into a liquid by means of using an assembly composed of a piezoelectric substrate, a first input-, a second input-, and an output interdigital transducers.

2. Description of the Prior Art

In constructing an acoustical system, a transducer for emitting and detecting an acoustic wave has a key role. A thickness mode piezoelectric transducer is usually used, whose operation frequency is dependent on the thickness of the piezoelectric substrate. Such a conventional type of transducer has a difficulty in high-frequency operation. A surface acoustic wave (SAW) propagates in the form of a leaky wave, when the piezoelectric substrate, sufficiently thicker compared with the wavelength, is in contact with a liquid. In this time, the leaky wave is mode-converted to a longitudinal wave into the liquid. This means that an interdigital transducer (IDT) on the piezoelectric substrate operates at a liquid-solid boundary as a leaky wave transducer for bulk wave radiation into the liquid. The leaky SAW traveling on a sufficiently thick substrate compared with the wavelength has only one mode without velocity dispersion. Thus, conventional transducers such as the thickness mode piezoelectric transducer and the IDT for the leaky SAW have the problem of the limited ultrasound-radiation angle.

SUMMARY OF THE INVENTION

An object of the present invention is to provide an ultrasound-signal radiating device capable of a multi-modes operation with a quick response and a high efficiency at a high frequency.

Another object of the present invention is to provide an ultrasound-signal radiating device capable of adjusting ultrasound power.

Another object of the present invention is to provide an ultrasound-signal radiating device capable of adjusting radiation angle.

Another object of the present invention is to provide an ultrasound-signal radiating device capable of a low electric power consumption.

Another object of the present invention is to provide an ultrasound-signal radiating device excellent in durability and manufacturing.

Another object of the present invention is to provide an ultrasound-signal radiating device which is not affected by a change in circumstances, for example, a change in temperature.

A still other object of the present invention is to provide an ultrasound-signal radiating device easy in use and having a small size which is very light in weight and has a simple structure.

According to one aspect of the present invention there is provided an ultrasound-signal radiating device comprising a piezoelectric substrate, a first input interdigital transducer, a second input interdigital transducer, an output interdigital transducer, a cap, an amplifier, and a modulator with an input terminal. All the interdigital transducers are formed on one end surface of the piezoelectric substrate. The cap is mounted on a surface part of the other end surface of the piezoelectric substrate. The surface part corresponds to a surface part, including the first input- and the output interdigital transducers, of the one end surface of the piezoelectric substrate.

If an input electric signal is applied to the first input interdigital transducer, a non-leaky elastic wave is excited in the piezoelectric substrate, The non-leaky elastic wave is transmitted to the output interdigital transducer, and detected at the output interdigital transducer as a delayed electric signal, which is amplified via the amplifier. A signal part of an amplified electric signal is fed back, as the input electric signal, to the first input interdigital transducer, again. A remaining signal part of the amplified electric signal is transmitted to the modulator as a carrier signal. If an input message-signal is applied to the modulator through the input terminal, an amplitude of the carrier signal is modulated according to the input message-signal. And then, an amplitude modulated (AM) signal is generated. When the AM signal is applied to the second input interdigital transducer, a leaky elastic wave is excited in the piezoelectric substrate, and radiated in the form of a longitudinal wave into a liquid kept in contact with a remaining surface part of the other end surface of the piezoelectric substrate.

According to another aspect of the present invention there is provided a voltage controller controlling a voltage of the carrier signal. Thus, the longitudinal wave is radiated, by an intensity corresponding to the voltage of the carrier signal, into the liquid kept in contact with the remaining surface part of the other end surface of the piezoelectric substrate. Accordingly, it is possible to adjust an ultrasound power into the liquid.

According to another aspect of the present invention there is provided a filter for adjusting a frequency of the input electric signal. A radiation angle $\theta$ into the liquid depends on an operation frequency. Therefore, it is possible to adjust the radiation angle $\theta$ into the liquid.

According to another aspect of the present invention there is provided a polymer film, with which at least the remaining surface part of the other end surface of the piezoelectric substrate is coated. Thus, the longitudinal wave is effectively radiated into a liquid in contact with an outside surface of the polymer film.

According to another aspect of the present invention there are provided another output interdigital transducer formed on the one end surface of the piezoelectric substrate and corresponding to the second input interdigital transducer, and a modulator with an output terminal. If a material exists in a liquid, the longitudinal wave radiated into the liquid is reflected at the material, and detected at the output interdigital transducer, corresponding to the second input interdigital transducer, as a delayed output signal, of which an amplitude is demodulated via the demodulator. And then, an output message-signal is delivered from the output terminal.

According to another aspect of the present invention there are provided another piezoelectric substrate, another output interdigital transducer formed on one end surface thereof and corresponding to the second input interdigital transducer, and a demodulator with an output terminal. If a material exists in a liquid, the longitudinal wave radiated into the liquid is reflected at the material, and detected at the output interdigital transducer, corresponding to the second input interdigital transducer, as a delayed output signal, of which an amplitude is demodulated via the demodulator. And then, an output message-signal is delivered from the output terminal.

According to another aspect of the present invention there is provided a piezoelectric substrate made of a piezoelectric ceramic thin plate, the polarization axis thereof being parallel to the thickness direction thereof. Thus, the elastic wave is effectively excited in the piezoelectric substrate.

According to other aspect of the present invention there is provided a piezoelectric substrate made of a piezoelectric polymer thin plate. Thus, the elastic wave is effectively excited in the piezoelectric substrate.

According to a further aspect of the present invention there is provided an ultrasound-signal radiating device, wherein the electrode-finger direction of the first input interdigital transducer is orthogonal to that of the second input interdigital transducer.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
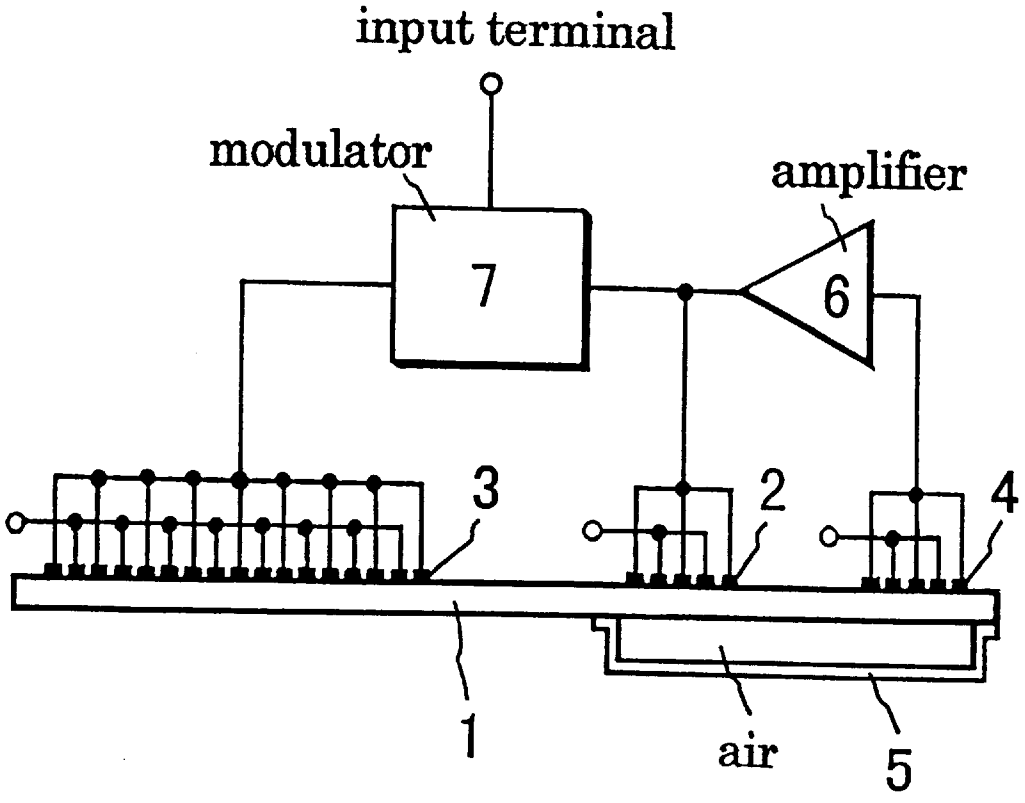
FIG. 1 shows a schematic illustration of an ultrasound-signal radiating device according to a first embodiment of the present invention.

FIG. 1 shows a schematic illustration of an ultrasound-signal radiating device according to a first embodiment of the present invention. The ultrasound-signal radiating device comprises piezoelectric substrate 1, first input interdigital transducer 2, second input interdigital transducer 3, output interdigital transducer 4, cap 5, amplifier 6, and modulator 7 having an input terminal. Piezoelectric substrate 1 is made of a piezoelectric ceramic thin plate with a dimension of 218 μm in thickness. It is possible to use a piezoelectric polymer thin plate as piezoelectric substrate 1. First input interdigital transducer 2, second input interdigital transducer 3, and output interdigital transducer 4, made of an aluminum thin film, respectively, are formed on one end surface of piezoelectric substrate 1. Cap 5 is mounted on a surface part, including first input interdigital transducer 2 and output interdigital transducer 4, of the other end surface of piezoelectric substrate 1. The surface part of the other end surface of piezoelectric substrate 1 is in contact with air. Thus, the ultrasound-signal radiating device in FIG. 1 has a small size which is very light in weight and has a simple structure.

Figure 2:
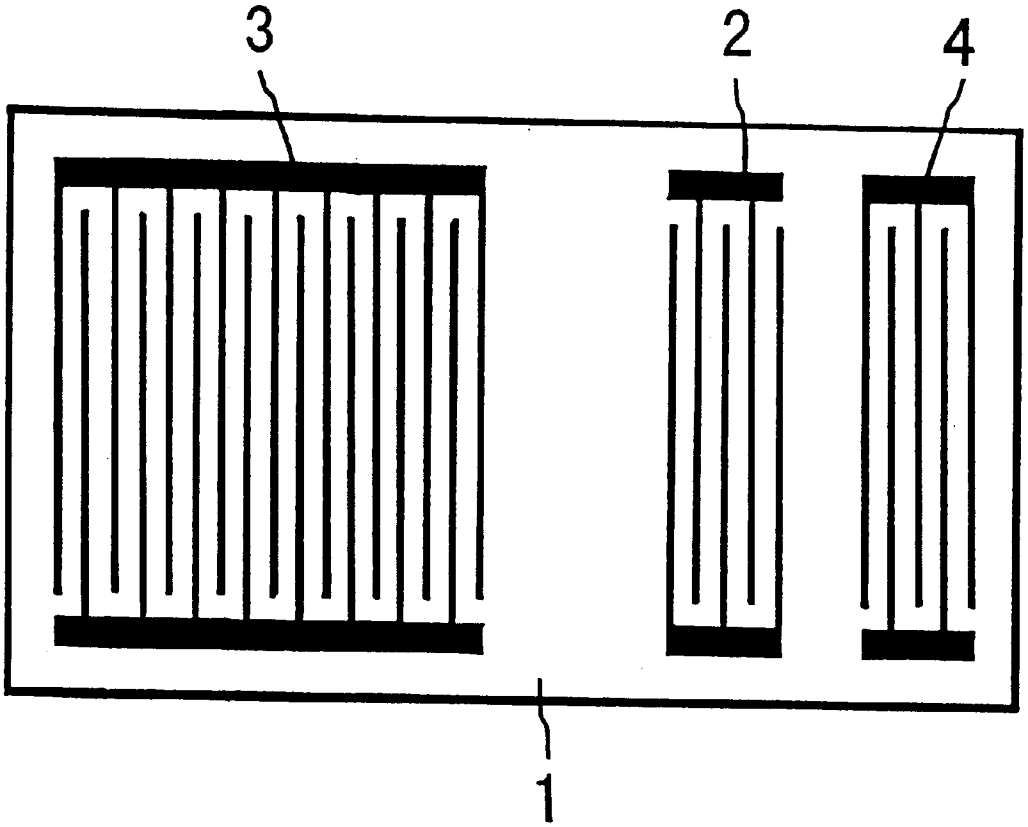
FIG. 2 shows a top plan view of an assembly composed of piezoelectric substrate 1, first input interdigital transducer 2, second input interdigital transducer 3, and output interdigital transducer 4, shown in FIG. 1.

FIG. 2 shows a top plan view of an assembly composed of piezoelectric substrate 1, first input interdigital transducer 2, second input interdigital transducer 3, and output interdigital transducer 4, shown in FIG. 1. First input interdigital transducer 2, second input interdigital transducer 3, and output interdigital transducer 4 have an interdigital periodicity of 430 μm, respectively. First input interdigital transducer 2 and output interdigital transducer 4 have 5 electrode-finger pairs, respectively. Second input interdigital transducer 3 has 60 electrode-finger pairs.

In the ultrasound-signal radiating device in FIG. 1, if an input electric signal is applied to first input interdigital transducer 2, a non-leaky elastic wave is excited in piezoelectric substrate 1. In this time, an elastic wave excited in piezoelectric substrate 1 is not leaked out from the surface part of the other end surface of piezoelectric substrate 1, owing to the existence of cap 5. Moreover, the non-leaky elastic wave is excited in piezoelectric substrate 1 effectively, because piezoelectric substrate 1 is made of a piezoelectric ceramic, and in addition, the polarization axis thereof is parallel to the thickness direction thereof. The non-leaky elastic wave is transmitted to output interdigital transducer 4, and detected at output interdigital transducer 4 as a delayed electric signal, which is amplified via amplifier 6. A signal part of an amplified electric signal via amplifier 6 is fed back, as the input electric signal, to first input interdigital transducer 2, again. Thus, first input interdigital transducer 2, output interdigital transducer 4, and amplifier 6 form a self-oscillation type of delay-line oscillator. On the other hand, a remaining signal part of the amplified electric signal is transmitted to modulator 7 as a carrier signal. If an input message-signal to be heard by human ears is applied to modulator 7 through the input terminal thereof, an amplitude of the carrier signal is modulated according to the input message-signal. And then, an AM signal is generated. When the AM signal is applied to second input interdigital transducer 3, a leaky elastic wave is excited in piezoelectric substrate 1, and radiated effectively in the form of a longitudinal wave into a liquid kept in contact with a remaining surface part of the other end surface of piezoelectric substrate 1.

Figure 3:
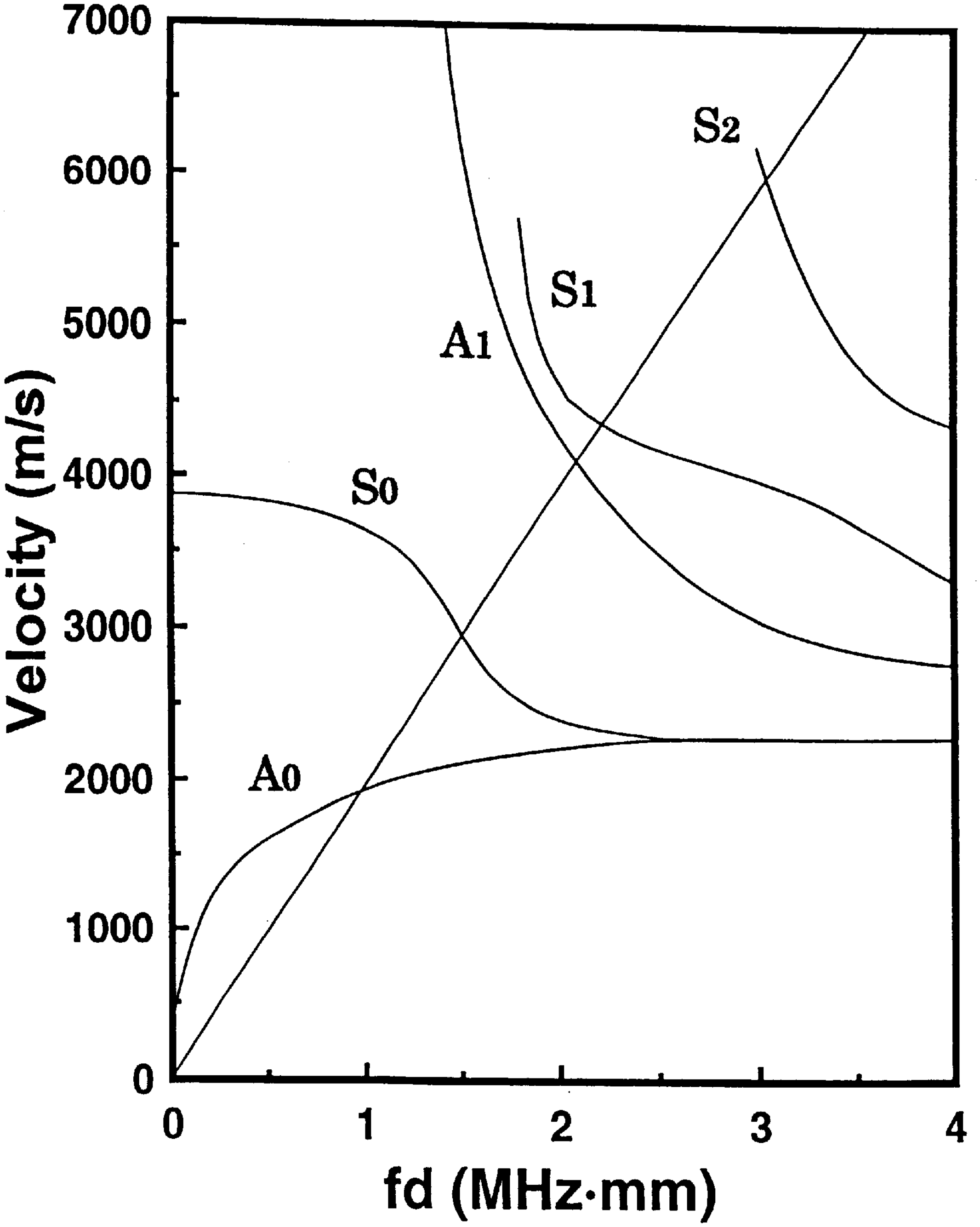
FIG. 3 shows a relationship between the phase velocity of an elastic wave for each mode in piezoelectric substrate 1, and the product fd.

FIG. 3 shows a relationship between the phase velocity of an elastic wave for each mode in piezoelectric substrate 1, and the product fd, where f is a frequency of the elastic wave and d is the thickness of piezoelectric substrate 1. Piezoelectric substrate 1 has a shear wave velocity of 2,450 m/s and a longitudinal wave velocity of 4,390 m/s. It should be noted that a multi-mode operation is available. In addition, under a higher-order mode operation, a higher velocity brings about a smaller radiation angle θ into the material. The radiation angle θ satisfies the relation of $\theta=\sin^{-1}V_m/V$, where $V_m$ is the longitudinal velocity in the material. As a result, the higher frequency operation, the smaller radiation angle θ.

Figure 4:
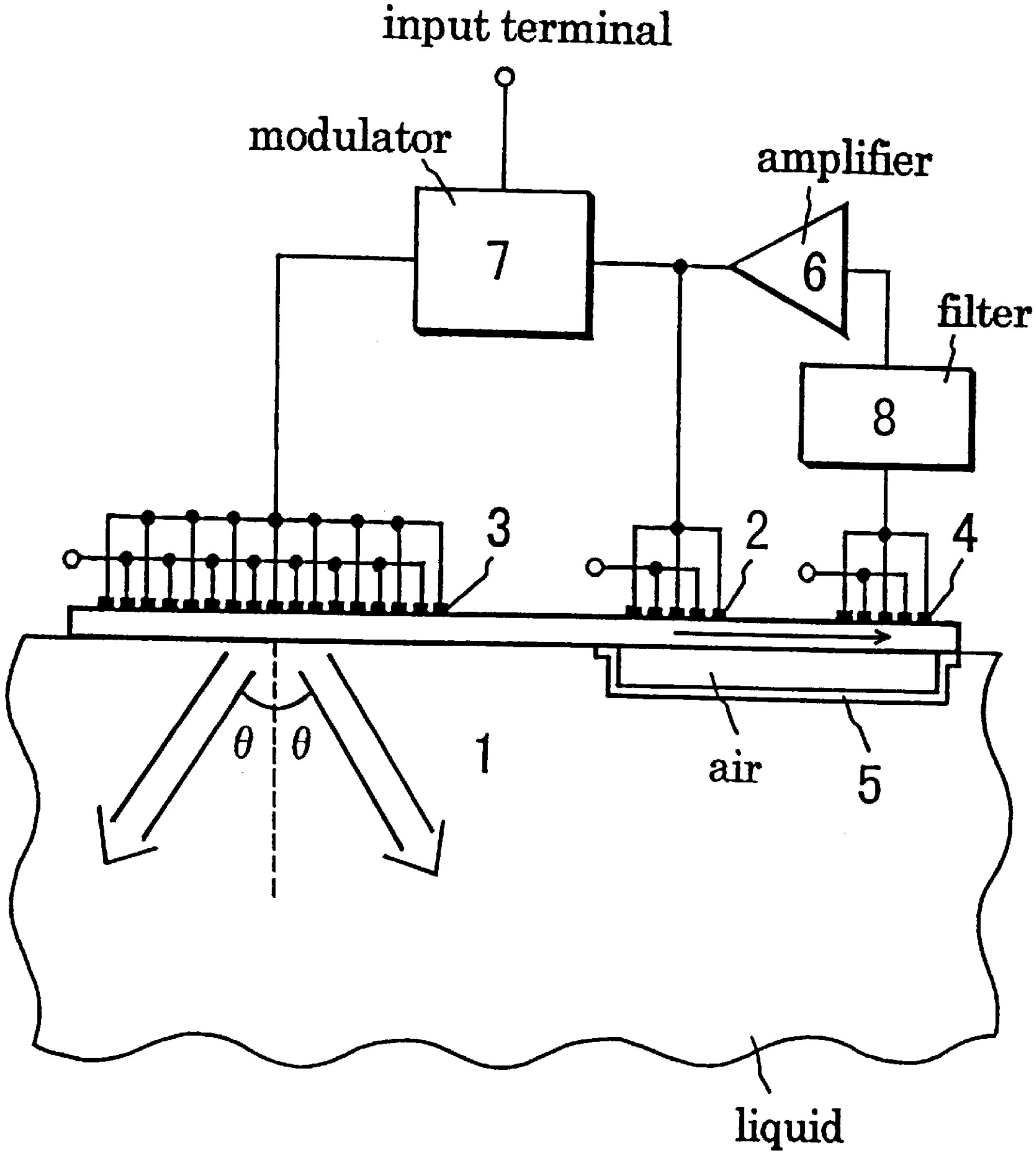
FIG. 4 shows a schematic illustration of an ultrasound-signal radiating device according to a second embodiment of the present invention.

FIG. 4 shows a schematic illustration of an ultrasound-signal radiating device according to a second embodiment of the present invention. In FIG. 4, a path of the longitudinal wave traveling in a liquid in contact with the remaining surface part of the other end surface of piezoelectric substrate 1 is also shown by an arrow. The ultrasound-signal radiating device has the same construction as FIG. 1, except for further comprising filter 8 for adjusting an operation frequency. As mentioned in FIG. 3, the radiation angle θ depends on the operation frequency. Thus, it is possible to adjust the radiation angle θ into the liquid.

Figure 5:
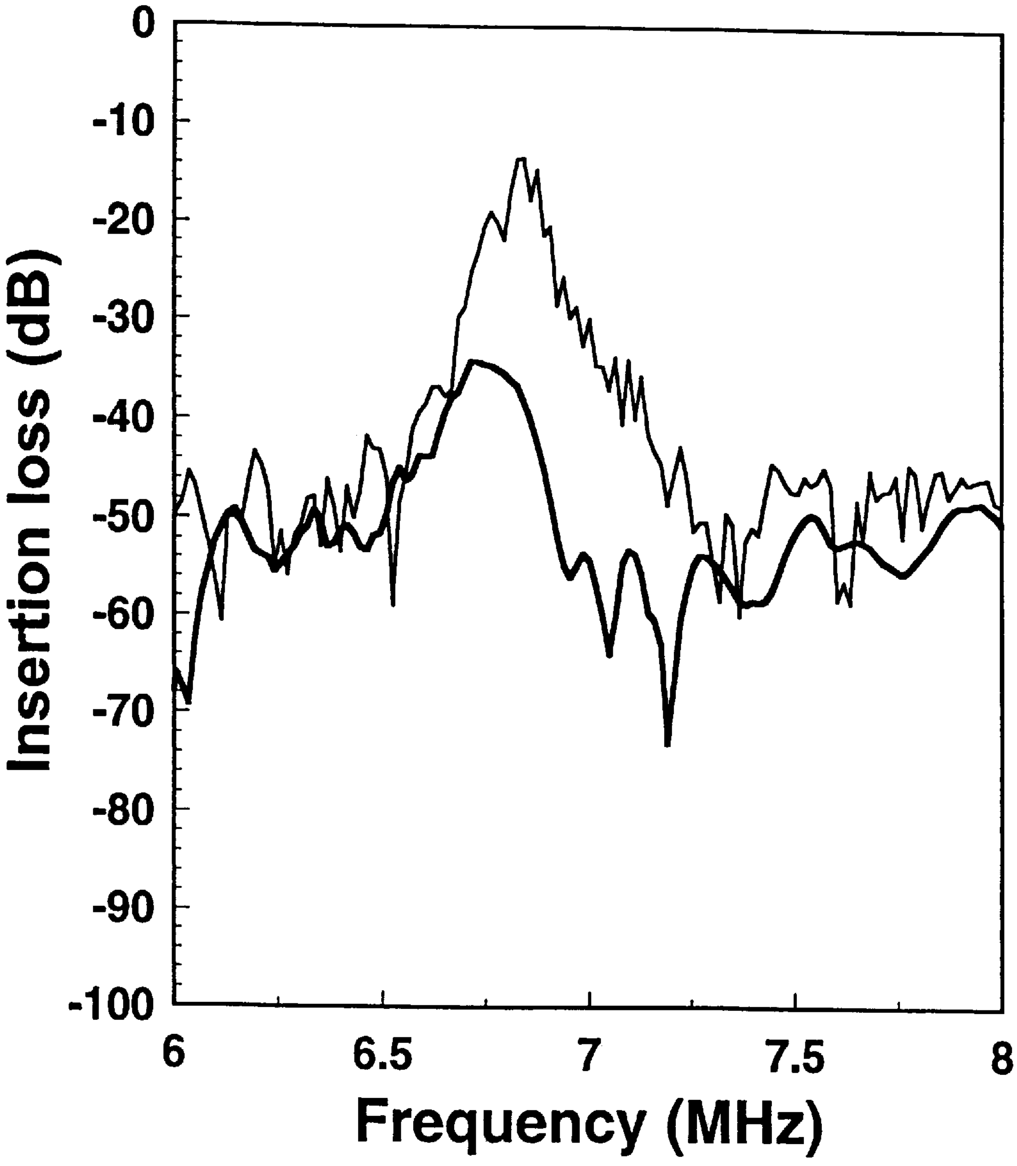
FIG. 5 shows a relationship between the insertion loss of an elastic wave in piezoelectric substrate 1 alone, and the frequency ranging 6–8 MHz.

FIG. 5 shows a relationship between the insertion loss of an elastic wave in piezoelectric substrate 1 alone, and the frequency ranging 6–8 MHz. A thin- and a thick lines correspond to a condition loaded with nothing and that loaded with water, on the remaining surface part of the other end surface of piezoelectric substrate 1, respectively. It should be noted that a difference in insertion loss, between the condition loaded with nothing and that loaded with water, is the greatest at approximately 6.8 MHz. In addition to the difference at approximately 6.8 MHz, large differences at approximately 4.3, 9.5, 14.4, and 19 MHz, respectively, are observed. This means that operations at these frequencies, respectively, are suitable for radiating the longitudinal wave, at second input interdigital transducer 3, into a liquid kept in contact with the remaining surface part of the other end surface of piezoelectric substrate 1.

Figure 6:
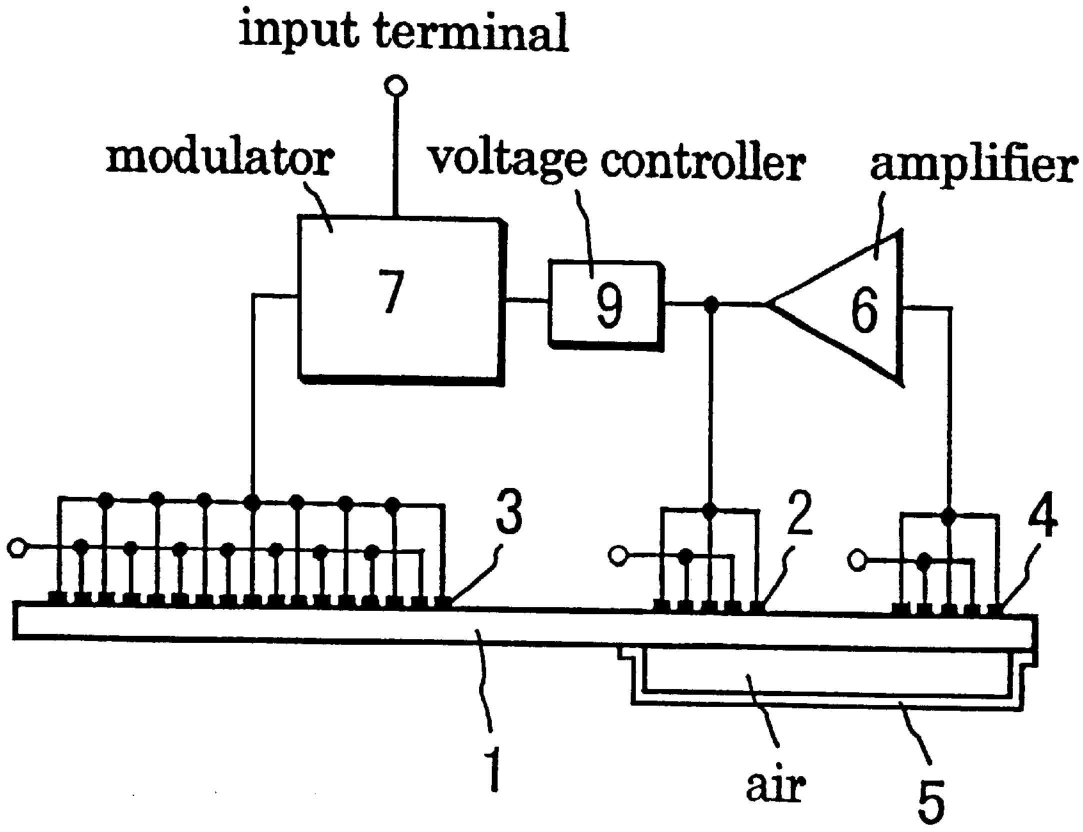
FIG. 6 shows a schematic illustration of an ultrasound-signal radiating device according to a third embodiment of the present invention.

FIG. 6 shows a schematic illustration of an ultrasound-signal radiating device according to a third embodiment of the present invention. The ultrasound-signal radiating device has the same construction as FIG. 1, except for further comprising voltage controller 9, which controls a voltage of the carrier signal. Thus, the longitudinal wave is radiated, by an intensity corresponding to the voltage of the carrier signal, into a liquid kept in contact with the remaining surface part of the other end surface of piezoelectric substrate 1. Accordingly, it is possible to adjust an ultrasound power into the liquid.

Figure 7:
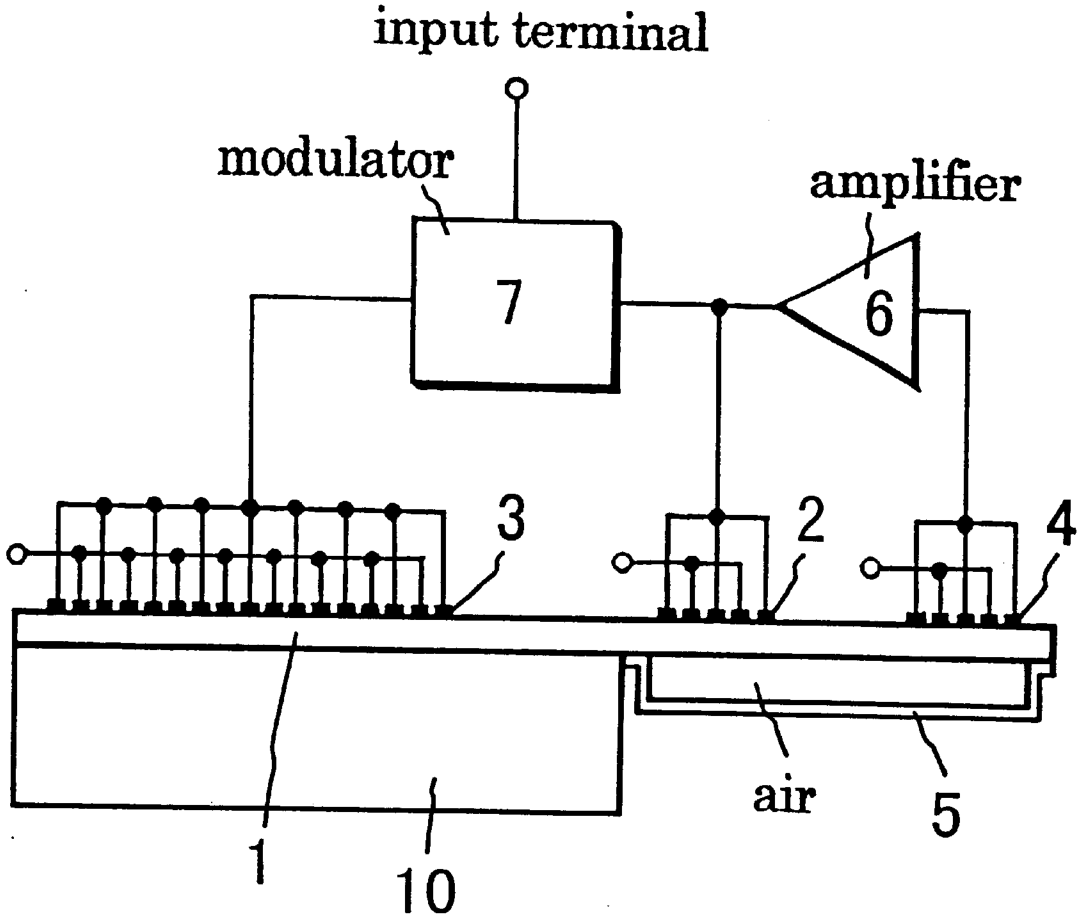
FIG. 7 shows a schematic illustration of an ultrasound-signal radiating device according to a fourth embodiment of the present invention.

FIG. 7 shows a schematic illustration of an ultrasound-signal radiating device according to a fourth embodiment of the present invention. The ultrasound-signal radiating device has the same construction as FIG. 1, except for further comprising polymer film 10, with which the remaining surface part of the other end surface of piezoelectric substrate 1 is coated. Polymer film 10, with a dimension of 1 mm in thickness, is made of a silicone rubber film, which excels in acoustic-impedance matching. Thus, the longitudinal wave is effectively radiated into a liquid in contact with an outside surface of polymer film 9.

Figure 8:
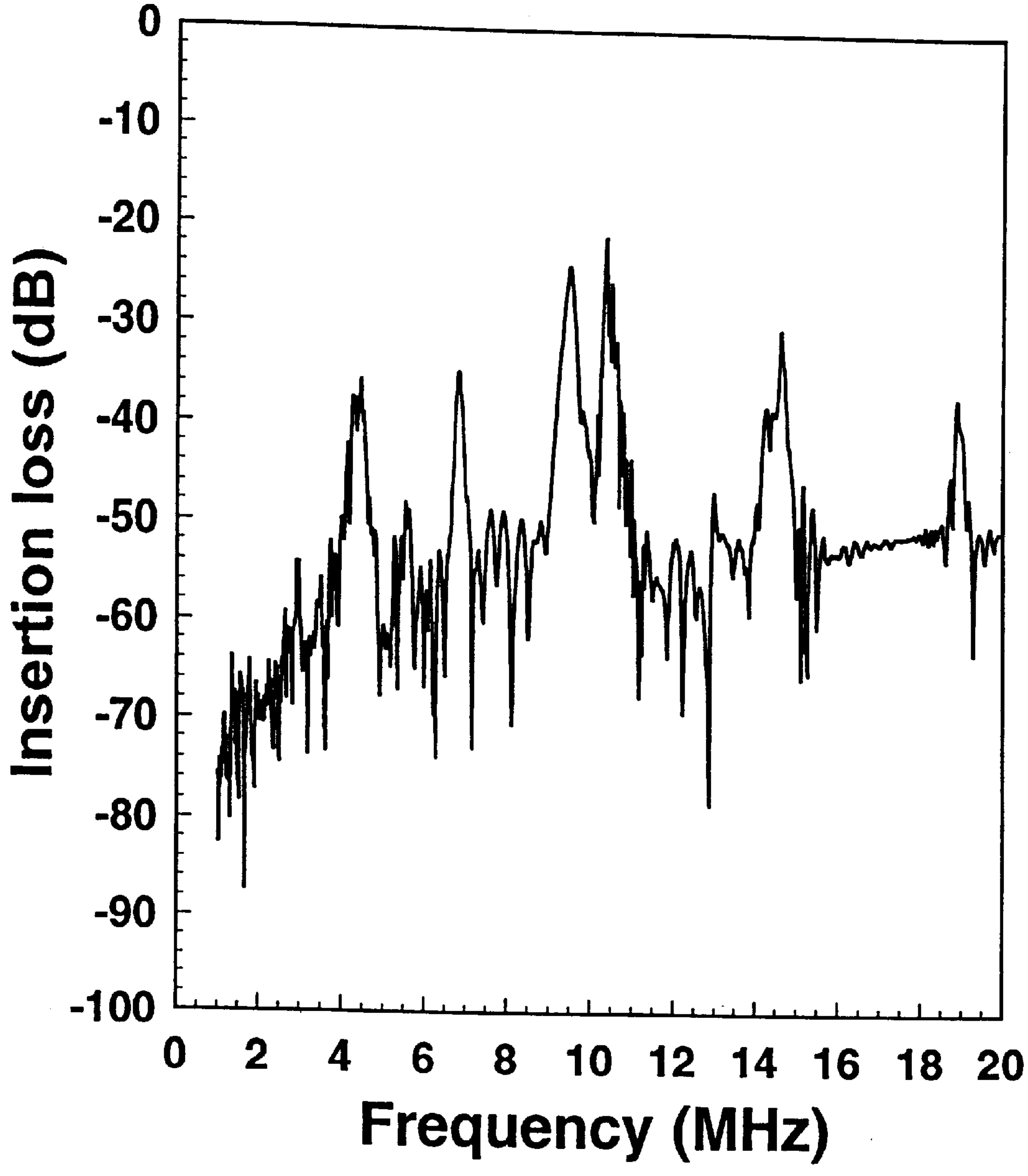
FIG. 8 shows a relationship between the frequency and the insertion loss of an elastic wave in a double-layer body composed of piezoelectric substrate 1 and polymer film 10.

FIG. 8 shows a relationship between the frequency and the insertion loss of an elastic wave in a double-layer body composed of piezoelectric substrate 1 and polymer film 10, of which the outside surface is in a condition loaded with water.

Figure 9:
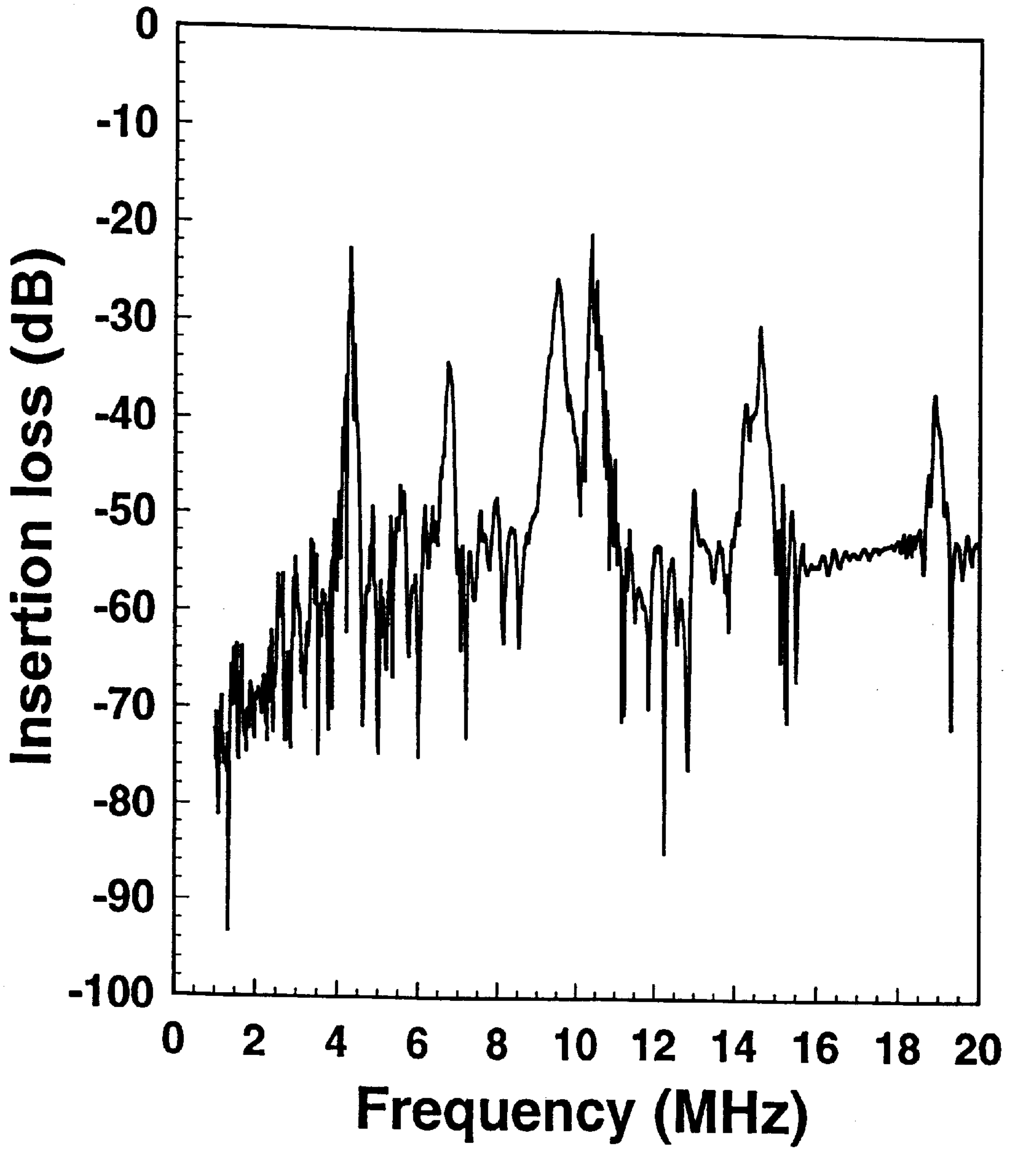
FIG. 9 shows a relationship between the frequency and the insertion loss of the elastic wave in the double-layer body composed of piezoelectric substrate 1 and polymer film 10.

FIG. 9 shows a relationship between the frequency and the insertion loss of the elastic wave in the double-layer body composed of piezoelectric substrate 1 and polymer film 10, of which the outside surface is in a condition loaded with nothing.

It is clear from FIGS. 8 and 9 that a difference in insertion loss, between the condition loaded with nothing and that loaded with water, is the greatest at approximately 4.3 MHz. This means that an operation at this frequency is suitable for radiating the longitudinal wave, at second input interdigital transducer 3, into the liquid in contact with the outside surface of polymer film 10.

Figure 10:
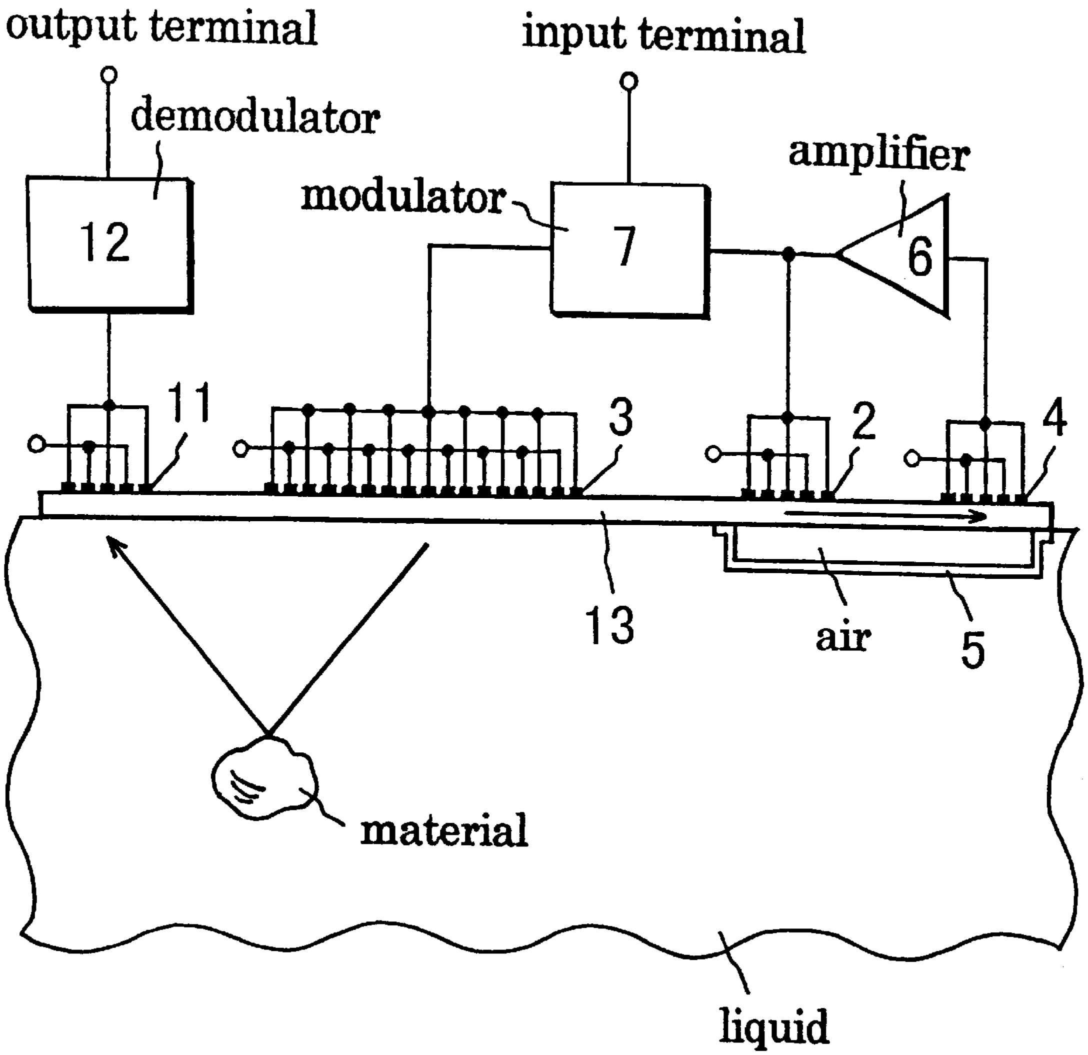
FIG. 10 shows a schematic illustration of an ultrasound-signal radiating device according to a fifth embodiment of the present invention.

FIG. 10 shows a schematic illustration of an ultrasound-signal radiating device according to a fifth embodiment of the present invention. The ultrasound-signal radiating device has the same construction as FIG. 1, except for further comprising another output interdigital transducer 11 and demodulator 12 with an output terminal, and for using piezoelectric substrate 13 in place of piezoelectric substrate 1. Piezoelectric substrate 13 is made of a piezoelectric ceramic thin plate with a dimension of 218 $\mu$m in thickness. Output interdigital transducer 11 has the same construction as output interdigital transducer 4, and is formed on one end surface of piezoelectric substrate 13. If a material exists in a liquid in contact with the remaining surface part of the other end surface of piezoelectric substrate 13, the longitudinal wave radiated into the liquid is reflected at the material. A reflected longitudinal wave is detected at output interdigital transducer 11 as a delayed output signal, of which an amplitude is demodulated via demodulator 12. And then, an output message-signal is delivered from the output terminal in demodulator 12. Thus, it is possible to make an input message-signal, for example, a music, pass through the liquid.

Figure 11:
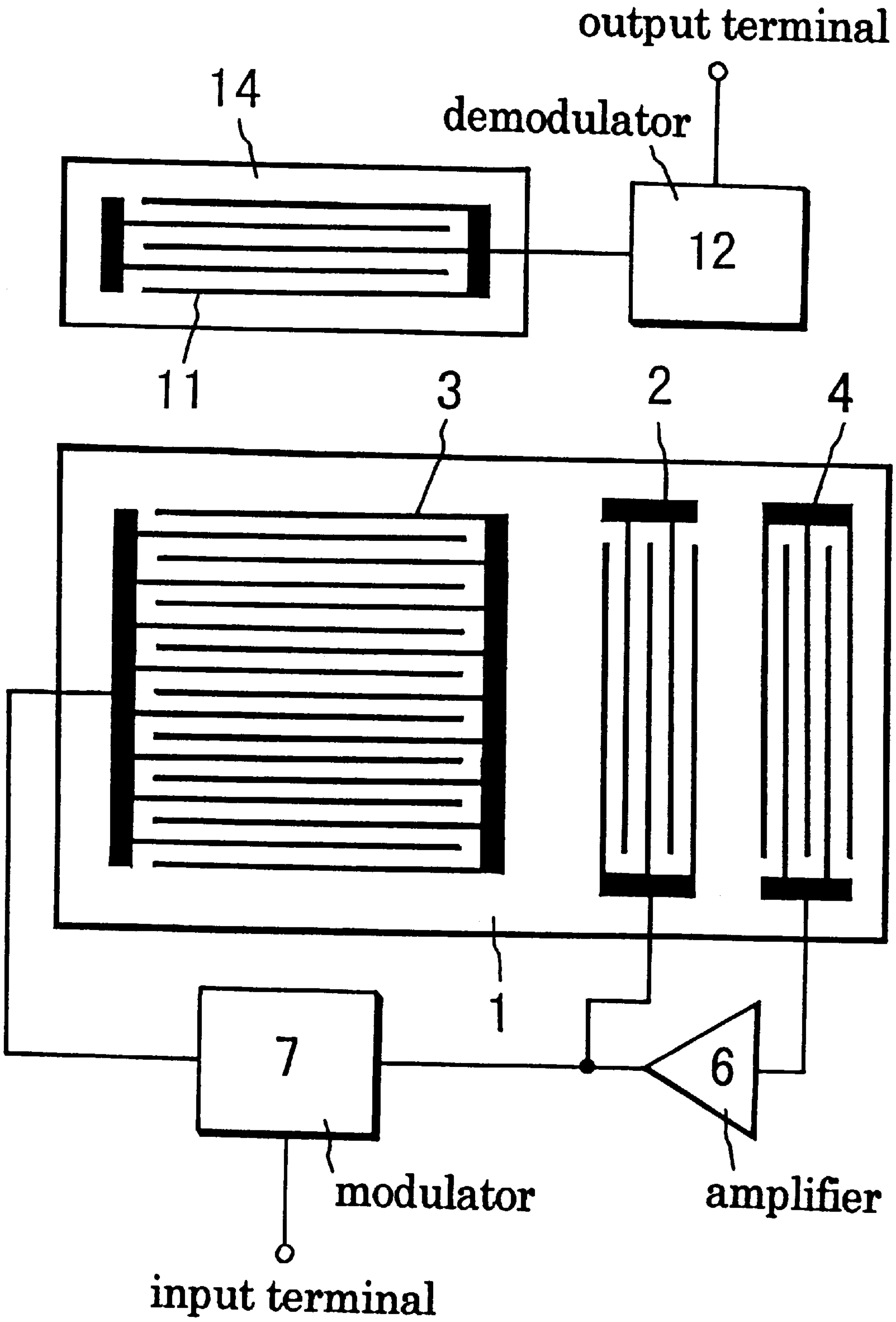
FIG. 11 shows a schematic illustration of an ultrasound-signal radiating device according to a sixth embodiment of the present invention.

FIG. 11 shows a schematic illustration of an ultrasound-signal radiating device according to a sixth embodiment of the present invention. The ultrasound-signal radiating device has the same construction as FIG. 1, except for the situation of second input interdigital transducer 3, and for further comprising another piezoelectric substrate 14, output interdigital transducer 11 and demodulator 12 with the output terminal. The electrode-finger direction of first input interdigital transducer 1 is orthogonal to that of second input interdigital transducer 3. Output interdigital transducer 11 is formed on one end surface of another piezoelectric substrate 14. If a material exists in a liquid in contact with the remaining surface part of the other end surface of piezoelectric substrate 1, the longitudinal wave radiated into the liquid is reflected at the material. A reflected longitudinal wave is detected at output interdigital transducer 11 as a delayed output signal through the other end surface of piezoelectric substrate 14. And then, an amplitude of the delayed output signal is demodulated via demodulator 12. Finally, an output message-signal is delivered from the output terminal. Thus, it is possible to make an input message-signal, for example, a music, pass through a liquid.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An ultrasound-signal radiating device comprising:

a piezoelectric substrate having two end surfaces;

a first input interdigital transducer;

a second input interdigital transducer;

an output interdigital transducer, all said first input-, said second input-, and said output interdigital transducers being formed on one end surface of said piezoelectric substrate;

a cap mounted on a surface part of the other end surface of said piezoelectric substrate, said surface part corresponding to a surface part, including said first input- and said output interdigital transducers, of said one end surface of said piezoelectric substrate;

an amplifier; and a modulator with an input terminal, said first input interdigital transducer receiving an input electric signal, exciting a non-leaky elastic wave in said piezoelectric substrate, said output interdigital transducer detecting said non-leaky elastic wave as a delayed electric signal, said amplifier amplifying said delayed electric signal and feeding a signal part, as said input electric signal, of an amplified electric signal, back to said first input interdigital transducer, again, said modulator receiving not only an input message-signal through said input terminal but also a remaining signal part, as a carrier signal, of said amplified electric signal, modulating an amplitude of said carrier signal according to said input message-signal, and generating an AM signal, said second input interdigital transducer receiving said AM signal, exciting a leaky elastic wave in said piezoelectric substrate, and radiating said leaky elastic wave in the form of a longitudinal wave into a liquid through a remaining surface part of said other end surface of said piezoelectric substrate.

2. An ultrasound-signal radiating device as defined in claim 1, further comprising a voltage controller controlling a voltage of said carrier signal.

3. An ultrasound-signal radiating device as defined in claim 1, further comprising a filter for adjusting a frequency of said input electric signal.

4. An ultrasound-signal radiating device as defined in claim 1, further comprising a polymer film, with which at least said remaining surface part of said other end surface of said piezoelectric substrate is coated.

5. An ultrasound-signal radiating device as defined in claim 1 further comprising:

another output interdigital transducer, formed on said one end surface of said piezoelectric substrate and detecting a reflected longitudinal wave at a material in said liquid as a delayed output signal through said remaining surface part of said other end surface of said piezoelectric substrate; and a demodulator with an output terminal, said demodulator receiving said delayed output signal, demodulating an amplitude of said delayed output signal, and delivering an output message-signal through said output terminal.

6. An ultrasound-signal radiating device as defined in claim 1 further comprising:

another piezoelectric substrate having two end surfaces;

another output interdigital transducer, formed on one end surface of said another piezoelectric substrate and detecting a reflected longitudinal wave at a material in said liquid as a delayed output signal through the other end surface of said another piezoelectric substrate; and a demodulator with an output terminal, said demodulator receiving said delayed output signal, demodulating an amplitude of said delayed output signal, and delivering an output message-signal through said output terminal.

7. An ultrasound-signal radiating device as defined in claim 1, wherein said piezoelectric substrate is made of a piezoelectric ceramic thin plate, the polarization axis thereof being parallel to the thickness direction thereof.

8. An ultrasound-signal radiating device as defined in claim 1, wherein said piezoelectric substrate is made of a piezoelectric polymer thin plate.

9. An ultrasound-signal radiating device as defined in claim 1, wherein the electrode-finger direction of said first input interdigital transducer is orthogonal to that of said second input interdigital transducer.

* * * * *